(12) United States Patent
Faust et al.

(10) Patent No.: US 7,215,000 B2
(45) Date of Patent: May 8, 2007

(54) SELECTIVELY ENCASED SURFACE METAL STRUCTURES IN A SEMICONDUCTOR DEVICE

(75) Inventors: Richard A. Faust, Dallas, TX (US); Young-Joon Park, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 96 days.

(21) Appl. No.: 10/924,346

(22) Filed: Aug. 23, 2004

(65) Prior Publication Data

US 2006/0038295 A1    Feb. 23, 2006

(51) Int. Cl.
H01L 29/00 (2006.01)
H01L 23/48 (2006.01)
H01L 23/52 (2006.01)
H01L 29/40 (2006.01)

(52) U.S. Cl. .............. 257/528; 257/531; 257/532; 257/750; 257/758; 257/E25.015

(58) Field of Classification Search ............. 257/379, 257/528–532, 758, 750
See application file for complete search history.

(56) References Cited

U.S. PATENT DOCUMENTS

| | | | |
|---|---|---|---|
| 6,236,101 B1 | 5/2001 | Erdeljac et al. | |
| 6,259,160 B1 | 7/2001 | Lopatin et al. | |
| 6,573,606 B2 | 6/2003 | Sambucetti et al. | |
| 6,646,323 B2* | 11/2003 | Dirnecker et al. | 257/532 |
| 6,646,345 B2 | 11/2003 | Sambucetti et al. | |
| 6,680,249 B2 | 1/2004 | Lu et al. | |
| 2003/0006415 A1* | 1/2003 | Yokogawa et al. | 257/77 |
| 2003/0203216 A1* | 10/2003 | Friese et al. | 428/446 |
| 2004/0104449 A1* | 6/2004 | Yoon et al. | 257/528 |
| 2005/0040471 A1* | 2/2005 | Harris et al. | 257/379 |

* cited by examiner

*Primary Examiner*—Nitin Parekh
(74) *Attorney, Agent, or Firm*—Jacqueline J. Garner; W. James Brady, III; Frederick J. Telecky, Jr.

(57) ABSTRACT

The present invention provides, in one embodiment, An integrated circuit device (100). The integrated circuit device (100) comprises a circuit feature (105) located over a semiconductor substrate (110) and an insulating layer (115) located over the circuit feature (105). A protective overcoat (120) is located over the insulating layer (115) and a metal structure (125) is located over the protective overcoat (120). The metal structure (125) is electrically connected to the circuit feature (105) by an interconnect (130). The metal structure (125) is coated with a conductive encasement (135), the conductive encasement (135) terminating at a perimeter (140) of the metal structure (125). Another embodiment of the invention in a method of manufacturing an integrated circuit device (200).

15 Claims, 5 Drawing Sheets

SELECTIVELY ENCASED SURFACE METAL STRUCTURES IN A SEMICONDUCTOR DEVICE

TECHNICAL FIELD OF THE INVENTION

The present invention is directed, in general, to the fabrication of a semiconductor device having surface metal structures.

BACKGROUND OF THE INVENTION

There is a growing demand in the communications industry for low-cost compact integrated circuits (IC) that incorporate digital and analog devices in a single chip. For instance, passive components such as resistors, inductors and capacitors can be advantageously included in radio-frequency metal oxide semiconductor (RF-MOS) circuits. The incorporation of such components, into semiconductor devices is not without problems, however.

Integrating thick metal lines of an inductor into a semiconductor device, for example, can cause parasitic capacitance between the inductor and the substrate. This, in turn, lowers the quality factor of the RF circuit, as measured by the Q-value, the ratio of the inductive reactance to its effective series resistance. Similarly, integrating the metal plates of a capacitor inside a semiconductor device can cause undesirable capacitive coupling to the substrate and increase the inherent series resistance of the plates.

One way to minimize these deleterious effects is to locate the metal structures comprising the inductor or capacitor outside of a non-conductive protective overcoat covering the IC's top surface. A non-conductive protective overcoat is typically used to prevent moisture or dirt from contacting circuit features in the IC. By removing the inductor as far from the substrate as possible and outside of the protective overcoat, parasitic capacitance can be reduced. Moreover, the placement of metal structures outside the protective overcoat advantageously uses the free area above the IC package to construct passive structures. When the passive structure is a capacitor, placement in this free area also helps lower the series resistance of the metal plates of the capacitor. Additionally, locating the inductor and the capacitor outside the protective overcoat facilitates construction of RF drive circuits outside the IC chip.

Locating metal structures at the surface of the IC can be problematic, however. For instance, certain metals are susceptible to oxidation. Oxidation increases the resistivity of the metal thereby reducing the Q-value for an inductor made of the metal. This can be problematic when, due to skin effects, the bulk of the current passing through the metal line of an inductor occurs at or near the surface of the metal line. Furthermore, metal lines, when subject to high current loads, can experience electro-migration (EM) effects. EM causes metal atoms to migrate down the metal line or between adjacent metal lines of the inductor, thereby bringing about a short circuit.

Alternatively, instead of leaving the surface metal uncovered, one may apply the non-conductive protective overcoat or encapsulating material. Unfortunately, however, such materials, as explained above, can cause a device to operate at slower than desired switching speed or have a reduced Q-value.

Accordingly, what is needed in the art is a method of protecting exposed metal structures at the surface of ICs without suffering the limitations of the prior art.

SUMMARY OF THE INVENTION

To address the above-discussed deficiencies of the prior art, one embodiment of the present invention provides an integrated circuit. The integrated circuit comprises a circuit feature located over a semiconductor substrate, an insulating layer located over the circuit feature, and a protective overcoat located over the insulating layer. The integrated circuit also includes a metal structure that is located over the protective overcoat and electrically connected to the circuit feature by an interconnect. The metal structure is coated with a conductive encasement that terminates at a perimeter of the metal structure.

Another embodiment is a method of manufacturing an integrated circuit. The method comprises forming a circuit feature over a semiconductor substrate and depositing an insulating layer over the circuit feature and the semiconductor substrate. The method further includes depositing a protective overcoat over the insulating layer and forming an interconnect structure in the insulating layer and through the protective overcoat. The method also comprises forming a metal structure over the protective overcoat and interconnecting the metal structure to the circuit feature by way of the interconnect structure. The metal structure is conformally coated with a conductive encasement and terminates at a perimeter of the metal structure.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention benefits from the understanding that a non-conductive protective overcoat overlying a surface metal structure can deleteriously alter the effective dielectric constant experienced by underlying circuit features in the IC. An increase in the effective dielectric constant of underlying circuit features inside the IC, in turn, reduces the operating speed of the IC. As well known by those skilled in the art, electrical switching speeds in an IC can be quantified by a time delay constant ($\tau$). The value of $\tau$ is the time required for a voltage applied to a circuit feature to reach a predefined percentage (e.g., 70%) of its maximum value. Because $\tau$ is proportional to the capacitance of the circuit feature, an increase in the effective dielectric constant of the insulator surrounding the circuit feature increases $\tau$.

Furthermore, the present invention recognizes, for the first time, that a conductive encasement selectively deposited on a surface metal structure can provide protection from both oxidation and EM effects, while not affecting $\tau$. Because the conductive encasement is more resistant to oxidation than the metal, the reliability and performance of the IC in an oxidizing atmosphere is improved. In addition, the conductive encasement provides a physical barrier to impede the EM of metal atoms along or between metal structures. Also, the use of a conductive encasement promotes the conduction of current through portions of the encasement instead of the metal structure. This, in turn, reduces the EM forces experienced by copper atoms in the surface metal structure, thereby further reducing deleterious EM effects. Additionally, because the encasement is conductive, it does not influence the dielectric constant experienced by underlying circuit features. Because the $\tau$ of these circuit features is substantially unaltered by the presence of the conductive encasement the switching speeds of the IC are not slowed down.

Although the present invention is discussed below in the context of encasing surface metal structures of passive structures, such as metal inductors and capacitors, the encasement could be applied to any surface metal structure that is prone to oxidation and EM effects, and where the use of a non-conductive protective overcoat is undesirable because of its effect on $\tau$.

Figure 1A:
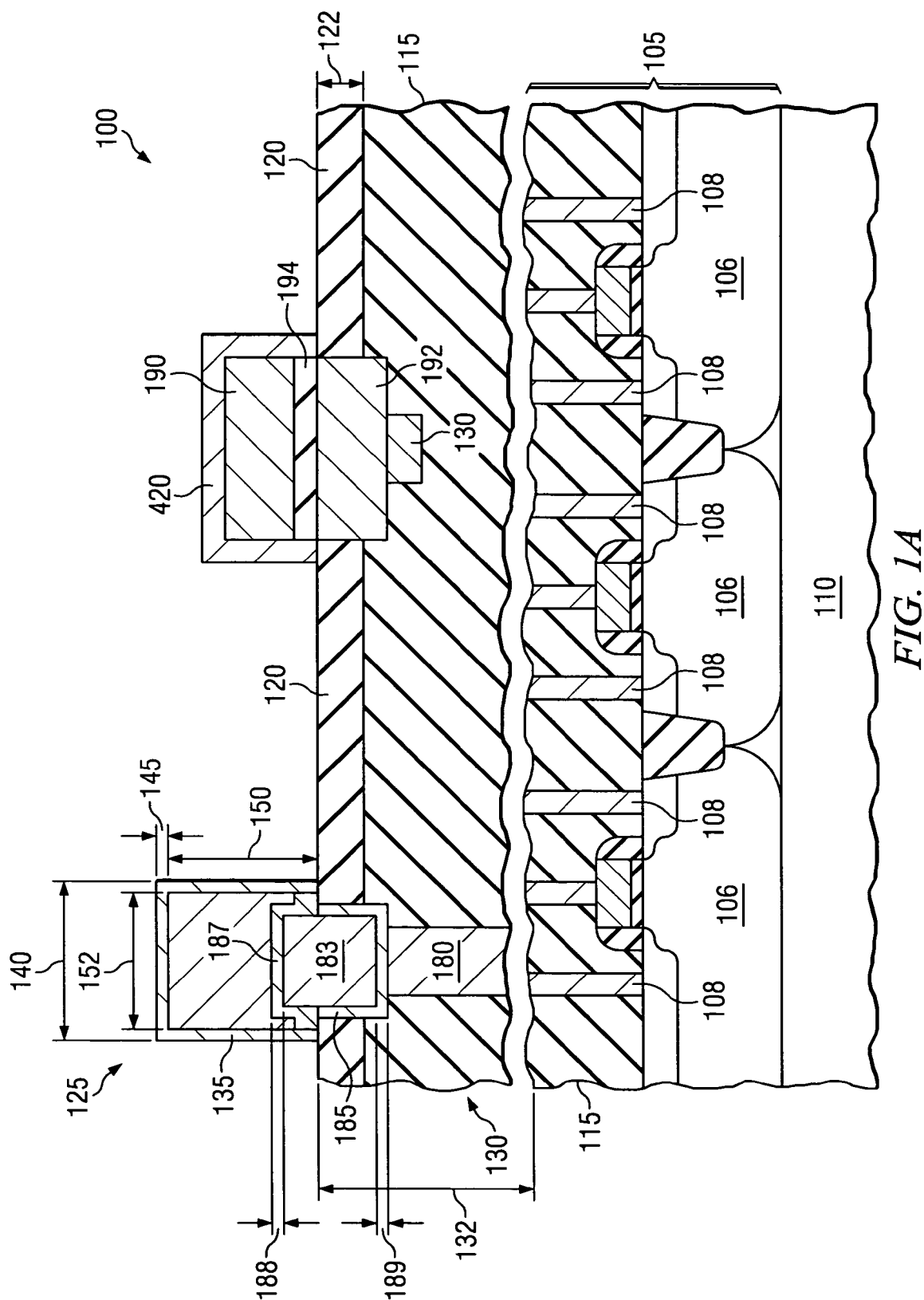
FIGS. 1A and 1B illustrate a sectional and plan view, respectively, of an exemplary integrated circuit of the present invention.

FIG. 1A illustrates a cross-sectional view one aspect of the present invention, an integrated circuit (IC) 100. The IC 100 comprises circuit features 105, such as MOS or bipolar transistors, that may be conventionally interconnected by vias 108. The IC 100 may include other conventional components, such as capacitors or resistors.

The circuit features 105 are located over a semiconductor substrate 110. The semiconductor substrate 110 can comprise any conventional material, such as silicon or silicon-on-insulator (SOI). The IC 100 also includes one or more insulating layers 115 located over the circuit features 105. In some cases, each of the insulating layers 115 have a thickness of about 1 to about 2 microns.

The insulating layers 115 can be formed of any conventional insulating material, such as silicon dioxide ($SiO_2$) or silicon nitride ($Si_3N_4$). More preferably, however, the insulating layers 115 are comprised of a low K dielectric material. The term dielectric constant as used herein refers to the multiplicative factor of the dielectric constant of the material of interest, as compared to the dielectric constant of air (about $8.85 \times 10^{-14}$ Farads/cm). The term low K dielectric material as used herein refers to a material whose dielectric constant relative to air is less than about 4. Examples of suitable low K dielectric materials include spin-on glass, organic silicate glass, or fluorosilicate glass.

The IC 100 also includes a protective overcoat 120 located over the insulating layer 115. The protective overcoat 120 can be any conventional material capable of protecting the IC 100 from moisture and dirt. Examples of suitable materials for the protective overcoat include silicon nitride ($Si_3N_4$) or silicon oxynitride ($SiO_xN_y$). In some preferred embodiments, the protective overcoat 120 has a thickness 122 of less than about 1 micron.

The IC 100 further includes a metal structure 125 located over the protective overcoat 120 and electrically connected to the circuit features 105 by an interconnect 130. In some embodiments the metal structure 125 corresponds to a passive structure, such as an inductor or capacitor. The metal structure 125, however, could be any surface metal feature of the IC 100 and that is prone to oxidation and EM effects. Preferably, the metal structure 125 is composed of a metal having a low resistivity. For instance, the metal structure 125 can be composed of aluminum, copper, gold, or alloys thereof. The interconnect 130 may comprise any conventional conductive material, including poly silicon, aluminum (Al), Copper (Cu) or combinations thereof.

Of course, the IC 100 can include a plurality of circuit features, insulating layers, protective overcoats, metal structures and interconnects. Preferably, however, at least one circuit feature 105 is separated from the metal structure 125 by a distance 132 of less than about 6 microns, and more preferably less than 2 microns. The circuit feature 105 can be at such a close distance 132 from the metal structure 125 because the metal structure 125 is not covered with an insulating layer or protective overcoat. As discussed above, blanket coverings of insulator would deleteriously increase the effective dielectric constant experienced by the circuit feature 105, thereby slowing its operating speed.

The metal structure 125 is coated with a conductive encasement 135 that terminates at a perimeter 140 of the metal structure 125. In some preferred embodiments of the IC 100, the conductive encasement 135 is exposed to an ambient environment surrounding the IC 100. In other instances, however, the conductive encasement 135 can be covered with additional insulating or protective layers. Preferably, the conductive encasement 135 comprises a material that facilitates its conformal coating of the metal structure 125. In some instances, it is advantageous for the conductive encasement 135 to be made of a metal alloy, and more preferably, a metal-phosphide or metal-boron alloy. Metals that facilitate a conformal coating are preferred. For example, in some cases the metal is selected from the group consisting of: Group 6 elements, Group 9 elements, Group 10 elements and a combination thereof. In other embodiments of the IC 100, however, the conductive encasement 135 comprises a single metal such as tungsten.

It can be advantageous for the conductive encasement 135 to have a thickness 145 that is large enough to carry a substantial portion (e.g., at least about 10%, and more preferably at least about 25%) of a current passing through the metal structure 125. For example, the thickness 145 of the conductive encasement 135 can be between about 0.25 and about 1 micron. Carrying a substantial portion of the current through the conductive encasement 135 has the advantage of reducing EM forces in the metal structure 125.

As noted above, various features shown in the FIG. 1A may not be drawn to scale and may be arbitrarily increased or reduced for clarity of discussion. Typically, the size of the metal structure 125 is substantially (e.g., 10 to 20 times) larger than the size of vias 108 of the circuit features 105. However, in some instances the use of the conductive encasement 135 advantageously allows the thickness 150 and the width 152 of the metal structure 125 to be reduced to dimensions that were not previously practical because of concerns about EM and oxidation effects. For instance, the metal structure 125 can have a thickness 150 as low as about 0.5 microns and a width 152 as low as about 0.5 microns. In some preferred embodiments, both the thickness 150 and width 152 are between about 0.5 and about 5 microns, and more preferably between about 1 and about 4 microns. The use of smaller thicknesses 150 and widths 152 are possible because the conductive encasement 135 protects smaller-dimensioned metal structure 125 that would otherwise be highly susceptible to EM and oxidation effects. Also, as noted above, because a substantial portion of the current can be carried by the conductive encasement 135, smaller metal structures 125 can be used without substantially altering the resistance of current traveling through the conductive encasement 135 and metal structures 125.

Figure 1B:
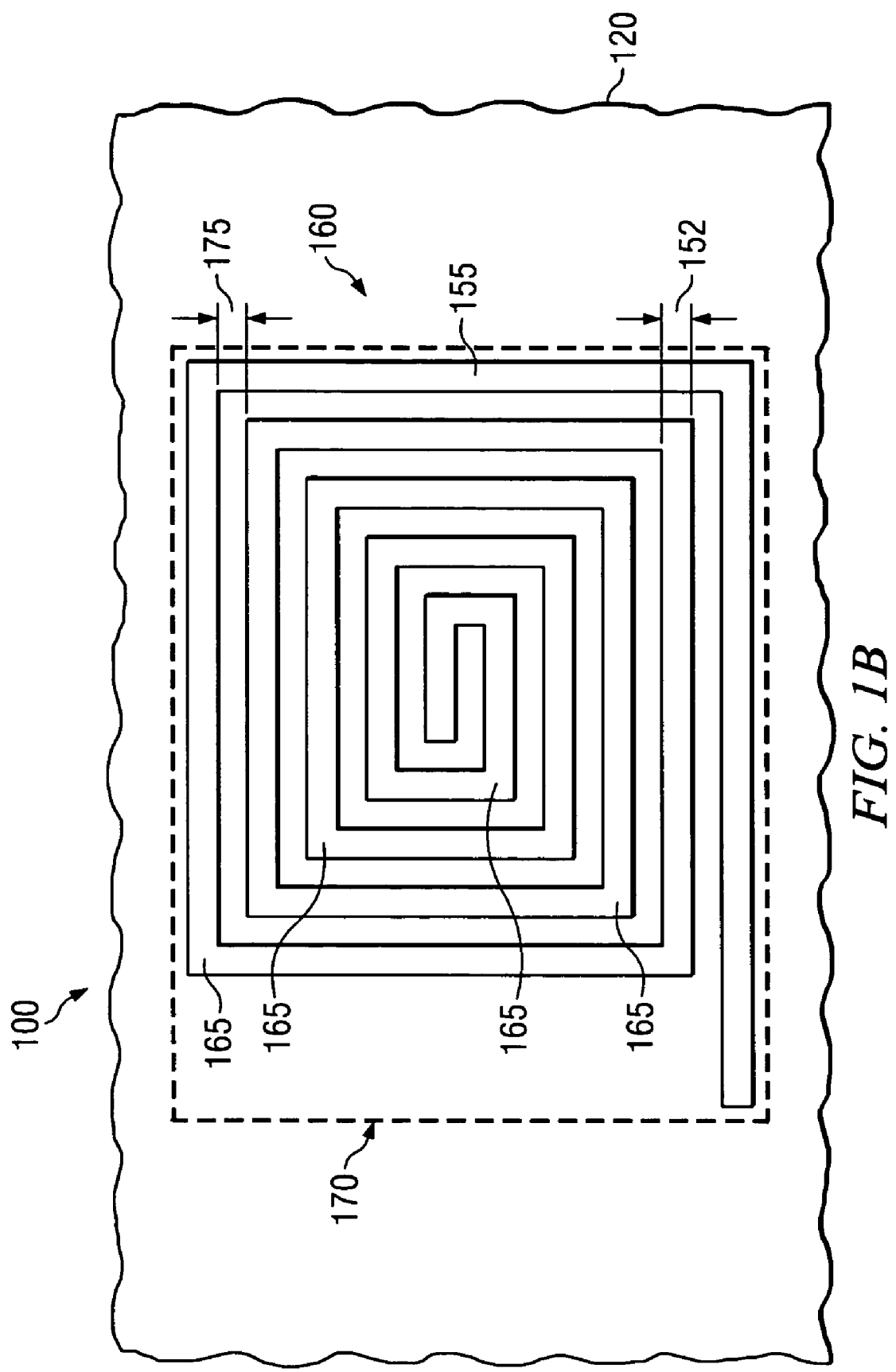

The ability to provide embodiments of the IC 100 having the smaller-dimensioned metal structure 125 offer a number of design advantages. This is illustrated in FIG. 1B, which shows a top view of the exemplary IC 100 similar to that depicted in FIG. 1A. In this example, the metal structure 125 (FIG. 1A) is a conductive line 155 of an inductor 160. A narrow width 152 is conducive to the fabrication of a high Q-value inductor because the inductor 160 can have a greater number of turns 165 per total area 170 of the inductor 160 than previously practical because on concerns about EM effects and oxidation. Because the width 152 of the line 155 is small, a large number of turns 165 can be introduced into a given area. For example, in some cases, the inductor 160 can have 10 or more turns 165 within the total area 170 of about $5.6 \times 10^4$ microns$^2$ or less. Of course, the total area 170 occupied by the inductor 160 can be adjusted by increasing or decreasing the number of turns 165, the width 152 of the conductive line 155 and the space 175 between different sections of the conductive line 155. In some instances, the space 175 between different sections of the line 155 is between about 0.5 and 5 microns. In other instances, the space 175 is substantially equal (e.g., within 10%) to the width 152 of the line 160.

Returning to FIG. 1A, in some preferred embodiments of the IC 100, the interconnect 130 comprises a via 180 and pad 183, the pad 183 located between the via 180 and the metal structure 125. Examples of suitable materials for the via 180 and pad 183 include copper, aluminum, gold or other low resistivity conductive metals. In some instances, it is advantageous to further include an etch stop barrier layer 185 or a metal barrier layer 187, or both, between the metal structure 125 and the interconnect 130. Titanium tungsten (TiW) is an example of an etch stop barrier layer 185 material while tantalum (Ta), tantalum nitride (TaN), tungsten nitride (WN$_x$; where x=~1 to ~2) or combinations thereof are examples of materials of the metal barrier layer 187. Of course, one skilled in the art would understand that other conventional materials could be used to form the etch stop barrier layer 185 or metal barrier layer 187.

As an example, in some embodiments, the TaN metal barrier layer 187, having a thickness 188 of between about 0.01 and about 0.1 microns is between the copper via 180 and the aluminum pad 183. The interconnect 130 can further include the TiW etch stop barrier layer 185, having a thickness 189 of between about 0.1 microns and about 0.5 microns, located between the metal structure 125 and the aluminum pad 183. In certain preferred embodiments, the etch stop barrier layer 185 and the metal barrier layer 187 terminate within or at the perimeter 140 of the metal structure 125.

As further illustrated in FIG. 1A, in some cases, the metal structure can be a top capacitor plate 190. Such embodiments of the IC 100 can further include a bottom capacitor plate 192 in electrical contact with the interconnect 130 and between the interconnect 130 and the top capacitor plate 190, and an insulator layer 194. The bottom capacitor plate can comprise metals, such as copper or aluminum or poly silicon, while the insulator layer 194 can comprise high K dielectric materials, such as silicon nitride.

Figure 2A:
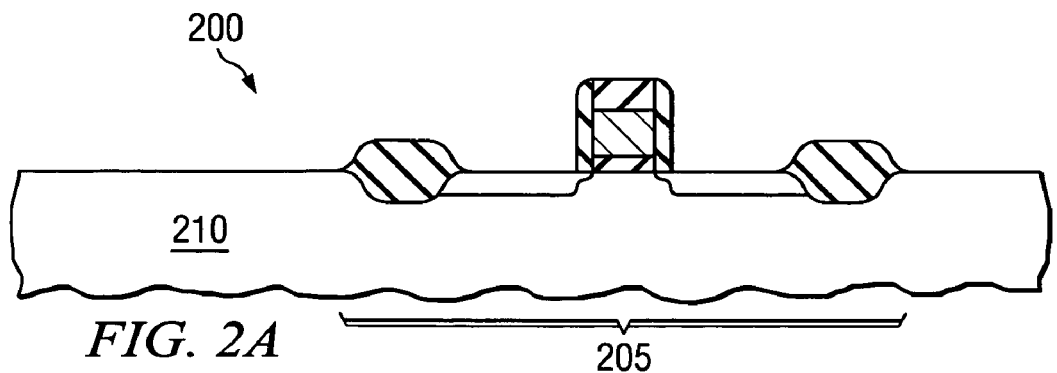
FIGS. 2A to 2F illustrate sectional views of selected steps in a method of manufacturing an exemplary integrated circuit according to the principles of the present invention.

Another aspect of the present invention is illustrated in a method of manufacturing an IC. FIGS. 2A–2F illustrate sectional views of selected steps in an exemplary method of making an IC 200. Turning first to FIG. 2A, illustrated is the partially completed IC 200 after forming a circuit feature 205 over a semiconductor substrate 210. For sake of simplicity, only one such circuit feature is shown. Any conventional processes can be used to form the circuit feature 205, including conventional photolithography, dopant implantation and chemical vapor and electrochemical deposition, and chemical mechanical polishing procedures.

Figure 2B:
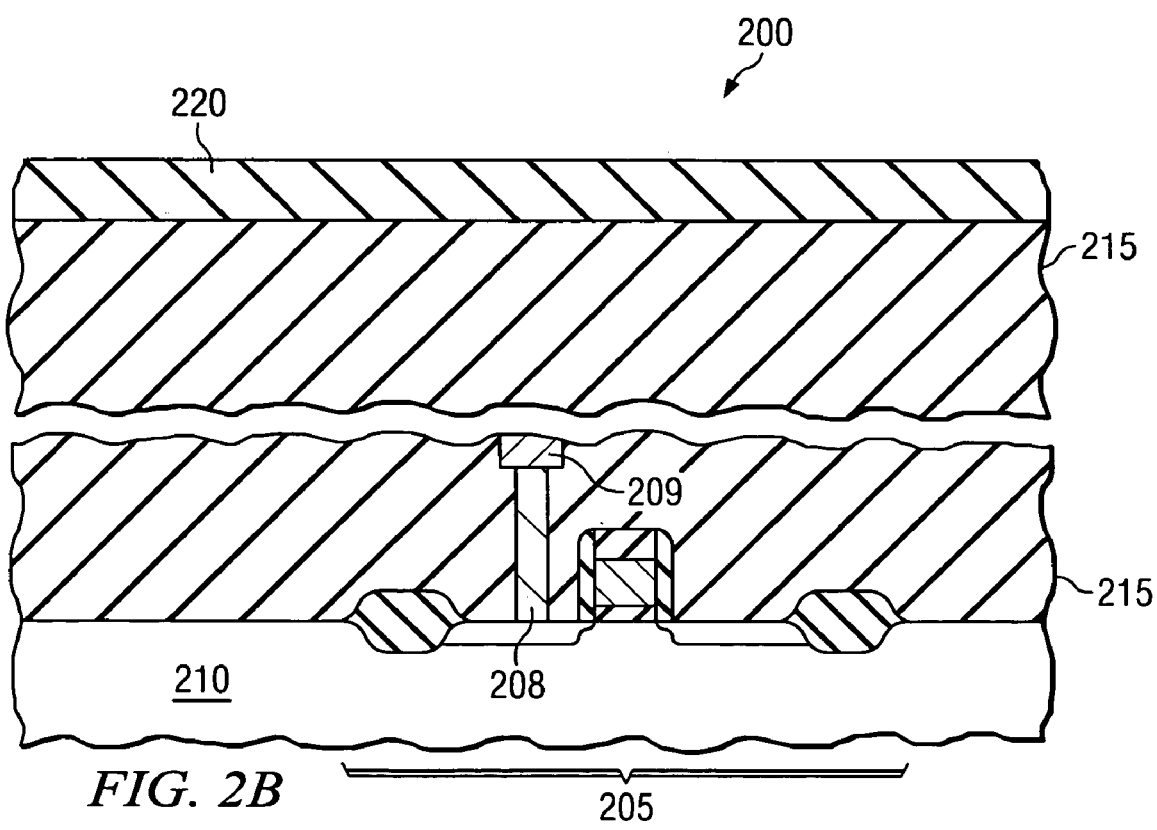

Referring now to FIG. 2B, shown is the partially completed IC 200 after depositing an insulating layer 215 over the circuit feature 205 and the semiconductor substrate 210. FIG. 2B shows a break between insulating layers 215 for purposes of illustrating that the IC 200 may include multiple layers 215 formed over one another. Of course, additional IC features, such a via 208 and an interconnect line 209 can be formed in multiple insulating layers 215 using conventional procedures. Each of the insulating layers 215 will typically comprise a layer of silicon dioxide deposited from tetraethyl orthosilicate (TEOS). In other cases the insulating layers 215 may be comprised of a low K dielectric material deposited by spin coating, chemical vapor deposition or other conventional procedures.

Figure 2C:
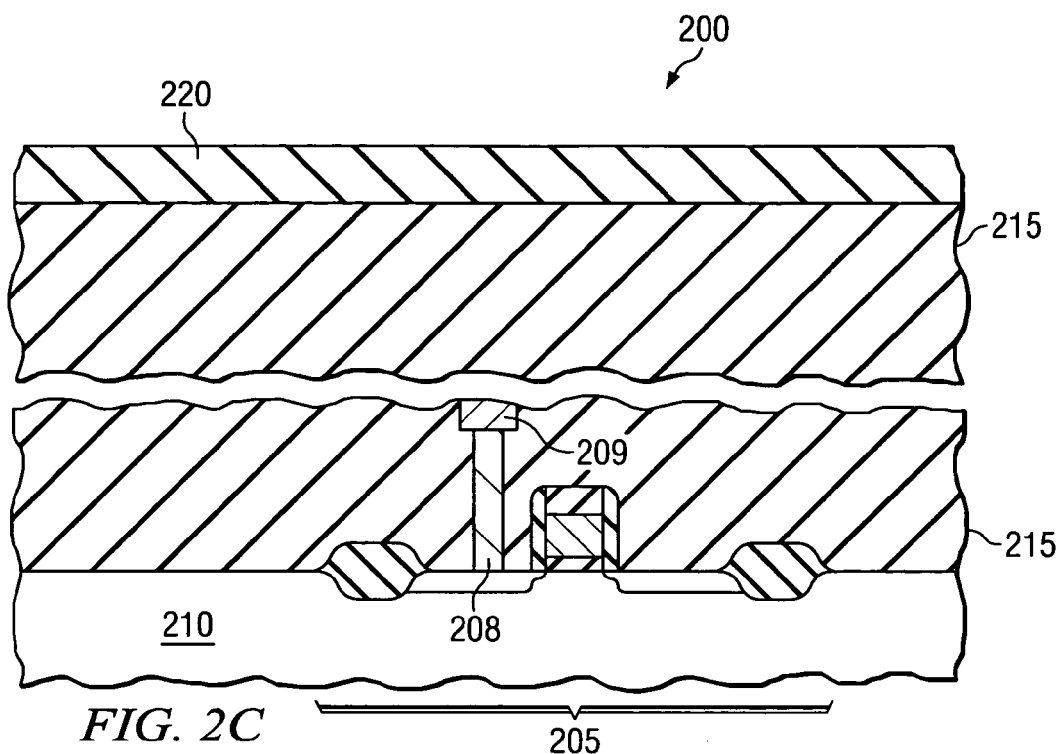

Continuing with FIG. 2C, shown is the partially completed IC 200 after depositing a protective overcoat 220 over an upper insulating layer 215. In some preferred embodiments, the protective overcoat 220 is chemical vapor deposited silicon nitride or silicon oxynitride.

Figure 2D:
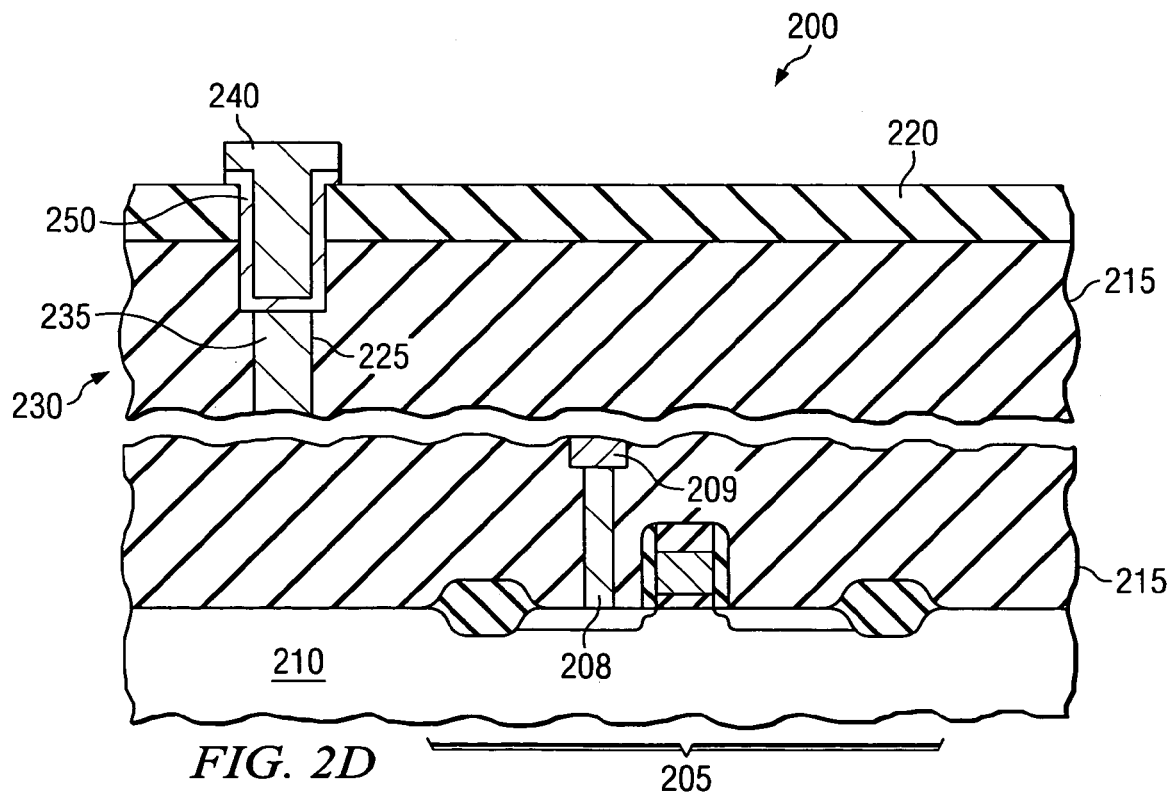

Turning to FIG. 2D, illustrated is the partially completed IC 200 after forming an opening 225 in the insulating layer 215 and protective overcoat 220, and filling the opening 225 with a conductive material such as copper or aluminum to form an interconnect structure 230. Preferably, the interconnect structure 230 is electrically coupled to the circuit feature 205. In some preferred embodiments, a metal is electrolytically deposited on the in the opening 225 to form a via 235. As further illustrated in FIG. 2D, in some advantageous embodiments, a metal plug 240 is formed over the via 235. In some cases, a metal barrier layer 250 is formed between the via 235 and the metal plug 240. For instance, when the via 235 is made of copper, and the metal plug 240 is made of aluminum, it is advantageous for the metal barrier layer 250 to be made of TaN. The barrier layer prevents diffusion of the copper into the surrounding insulating layer 215.

Figure 2E:
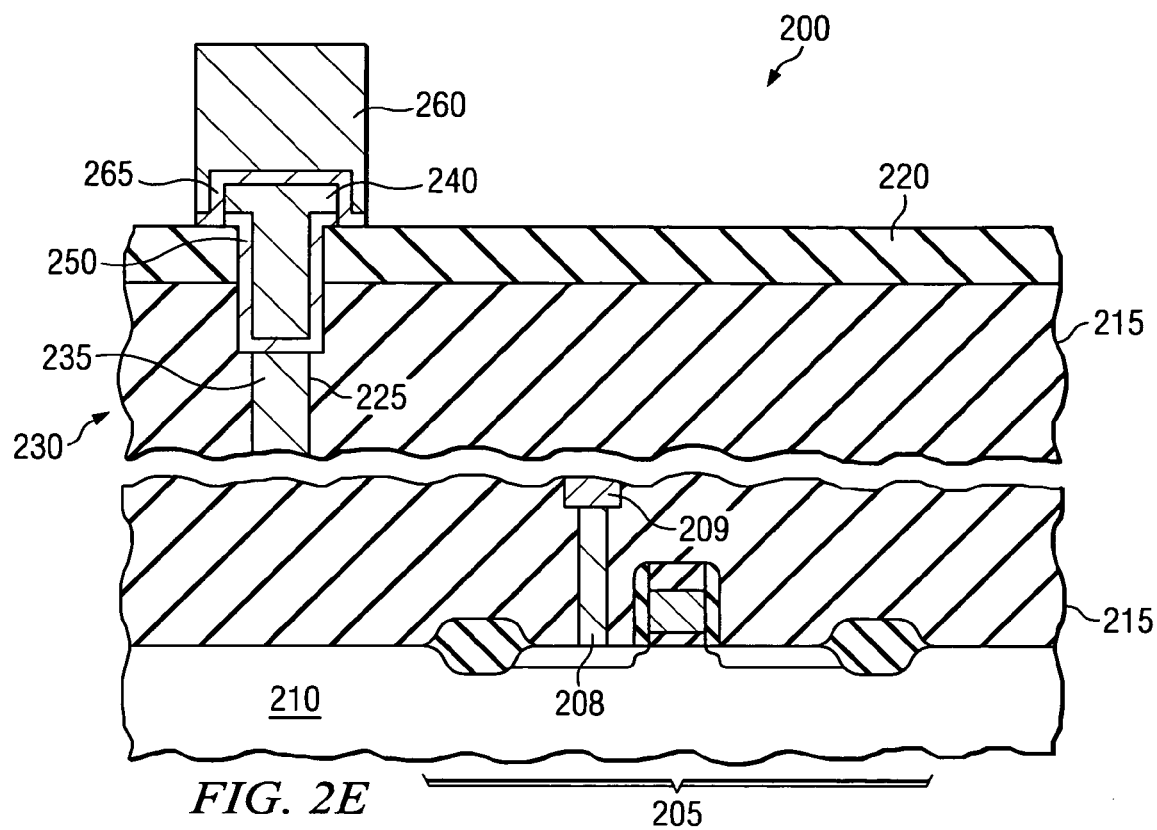

Referring now to FIG. 2E, illustrated is the partially completed IC 200 after forming a metal structure 260, such as an inductor, over the protective overcoat 220. The metal structure 260 is interconnected to the circuit feature 205 by way of the interconnect structure 230. In some preferred embodiments, the metal structure 260 is formed by covering the protective overcoat 220 by depositing a photoresist, patterning the photoresist to form an opening over the interconnect structure 230, and depositing a metal in the opening 225. In some cases, it is advantageous for a metal etch stop 265, such as TiW, to be deposited over the protective overcoat 220 and between the interconnect 230 and the metal structure 260.

Figure 2F:
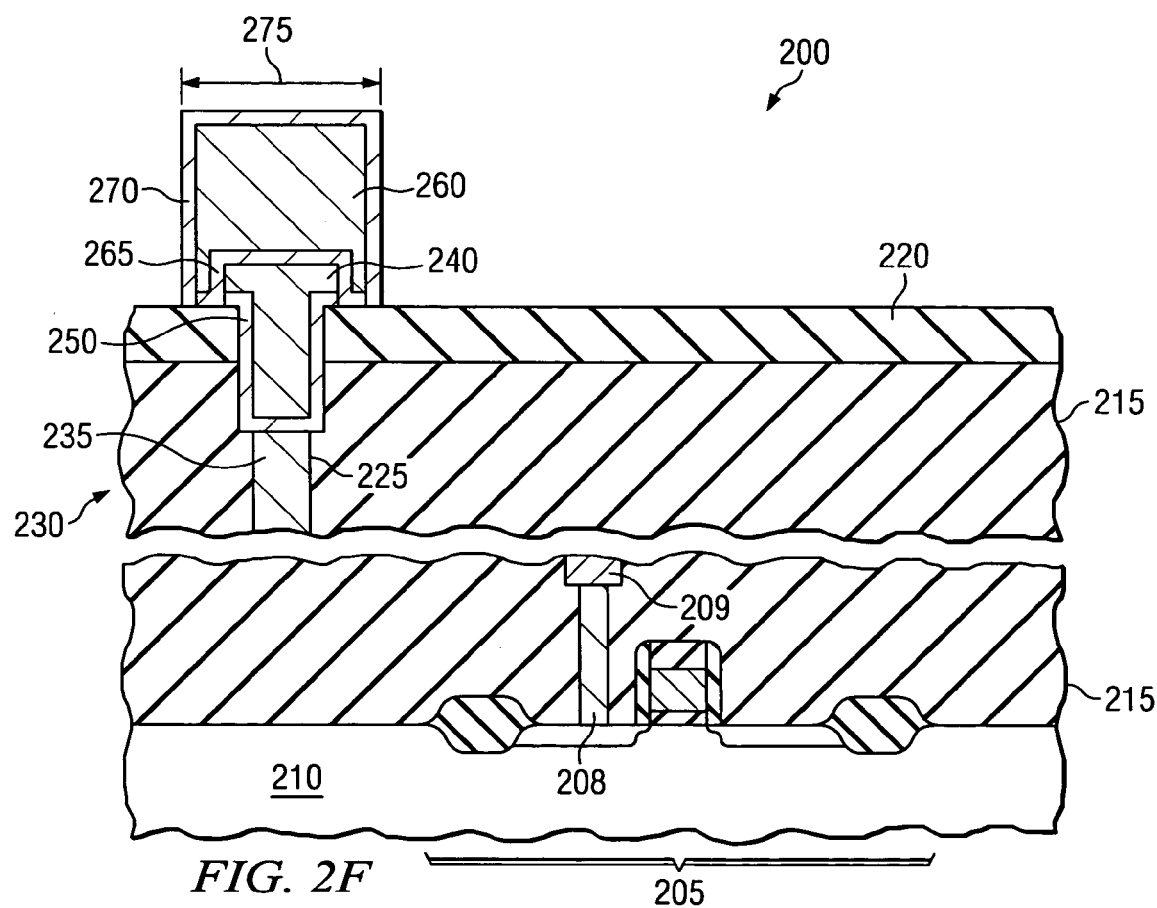

Turning now to FIG. 2F, shown is the IC 200 after conformally coating the metal structure 260 with a conductive encasement 270, such that it terminates at a perimeter 275 of the metal structure 260. In some embodiments, the metal barrier layer 250 and metal etch stop 265 also terminate at the perimeter 275 of the metal structure 260. In some instances, the conformally coating involves growing the conductive encasement 270 on exposed surfaces of the metal structure 260 by an electroless process. As well understood by those skilled in the art, certain metals, such as copper, facilitate the growth of metal alloys, described above, to form the conductive encasement 270 thereon. In other instances, the conductive encasement 270 can be formed by the selective chemical vapor deposition of a suitable metal, such as tungsten.

Although the present invention has been described in detail, one of ordinary skill in the art should understand that they can make various changes, substitutions and alterations herein without departing from the scope of the invention.

What is claimed is:

1. An integrated circuit device, comprising:
    a circuit feature located over a semiconductor substrate;
    an insulating layer located over said circuit feature;
    a protective overcoat located over said insulating layer; and
    a metal structure located over said protective overcoat and electrically connected to said circuit feature by an interconnect, wherein said metal structure is coated with a conductive encasement, said conductive encasement terminating at a perimeter of said metal structure wherein said metal structure is a line in an inductor.

2. The integrated circuit device recited in claim 1, wherein said conductive encasement is exposed to an ambient environment.

3. The integrated circuit device recited in claim 1, wherein said conductive encasement is a metal alloy, and wherein said metal is an element selected from the group consisting of: Group 6 elements, Group 9 elements, Group 10 elements and a combination thereof.

4. The integrated circuit device recited in claim 1, wherein said conductive encasement comprises tungsten.

5. The integrated circuit device recited in claim 1, wherein said metal structure has a thickness of about 0.5 microns or more and a width of about 0.5 microns or more.

6. The integrated circuit device recited in claim 5, wherein said thickness is between about 1 and about 5 microns and said width is between about 1 and about 5 microns.

7. The integrated circuit device recited in claim 1, further includes an etch stop barrier layer of titanium tungsten and a metal barrier layer between said interconnect and said metal structure.

8. The integrated circuit device recited in claim 1, wherein said interconnect comprises a via and a pad, said pad located between said via and said metal structure.

9. The integrated circuit device recited in claim 1, wherein said insulator layer is a low K dielectric.

10. The integrated circuit device recited in claim 1, wherein said insulator layer has a thickness of less than about 1 micron.

11. The integrated circuit device recited in claim 1, wherein said circuit feature includes at least one MOS transistor.

12. The integrated circuit device recited in claim 1, wherein said protective overcoat is selected from the group consisting of silicon nitride ($Si_3N_4$), silicon oxynitride ($SiO_xN_y$) and a combination thereof.

13. The integrated circuit device recited in claim 1, wherein said circuit feature is within about 6 microns of said metal structure.

14. The integrated circuit device recited in claim 1, further includes an etch stop barrier layer of titanium tungsten and a metal barrier layer between said interconnect and said metal structure and wherein said interconnect comprises a via and a pad, said pad located between said via and said metal structure.

15. An integrated circuit device, comprising: a circuit feature located over a semiconductor substrate;
    an insulating layer located over said circuit feature;
    a protective overcoat located over said insulating layer; and
    a metal structure located over said protective overcoat and electrically connected to said circuit feature by an interconnect, wherein said metal structure is coated with a conductive encasement, said conductive encasement terminating at a perimeter of said metal structure, and wherein said metal structure is a top capacitor plate.

* * * * *